United States Patent [19]

Ting

[11] Patent Number: 5,742,094
[45] Date of Patent: Apr. 21, 1998

[54] SEALED SEMICONDUCTOR CHIP

[75] Inventor: Chiu H. Ting, Saratoga, Calif.

[73] Assignee: Intel Corporation, Santa Clara, Calif.

[21] Appl. No.: 293,120

[22] Filed: Aug. 19, 1994

Related U.S. Application Data

[60] Continuation of Ser. No. 138,956, Oct. 19, 1993, abandoned, which is a division of Ser. No. 8,469, Jan. 25, 1993, Pat. No. 5,300,461.

[51] Int. Cl.$^6$ ............................ H01L 21/80; H01L 23/29; H01L 23/31
[52] U.S. Cl. ........................... 257/620; 257/640; 257/737; 257/786; 257/787; 438/114
[58] Field of Search ..................... 257/640, 641, 257/786, 760, 737, 738, 620, 787; 437/227, 228; 438/114, 113

[56] References Cited

U.S. PATENT DOCUMENTS

| | | | |
|---|---|---|---|
| 4,665,426 | 5/1987 | Allen et al. | 257/640 |
| 4,843,037 | 6/1989 | Yablonovitch et al. | 257/629 |
| 4,970,571 | 11/1990 | Yamakawa et al. | 257/766 |
| 5,024,970 | 6/1991 | Mori | 437/227 |
| 5,055,906 | 10/1991 | Mase et al. | 257/640 |
| 5,136,364 | 8/1992 | Byrne | 257/751 |
| 5,157,001 | 10/1992 | Sakuma | 437/227 |

FOREIGN PATENT DOCUMENTS

| | | | |
|---|---|---|---|
| 0027684 | 2/1980 | Japan | 437/227 |
| 0124244 | 9/1980 | Japan | 437/227 |
| 0048247 | 3/1982 | Japan | 257/641 |
| 0110122 | 6/1984 | Japan | 257/641 |
| 0093949 | 4/1987 | Japan | 437/241 |
| 0238126 | 9/1989 | Japan | 437/241 |
| 0312837 | 12/1989 | Japan | 257/640 |
| 0308551 | 12/1990 | Japan . | |

OTHER PUBLICATIONS

T.C. Hall et al., Photonitride Passivating Coating For IC's, NASA Tech Briefs, vol. 5, No. 2, Summer 1980, pp. 231–232.

*Primary Examiner*—Peter Toby Brown
*Attorney, Agent, or Firm*—Blakely, Sokoloff, Taylor & Zafman

[57] ABSTRACT

Described is a structure and process for forming a hermetically sealed chip. This hermetically sealed chip will greatly simplify packaging requirements and eventually lead to the realization of a "packageless chip". The hermetic sealing is composed of two parts, an extremely thin passivation layer which is deposited over the entire chip top and side surfaces and a passivation layer which is deposited over the bonding pad surface. Preferably, SiN is deposited as a chip surface passivation layer and Ni is selectively deposited as a metal passivation layer. The extremely thin nitride layer will minimize the stress and the amount of hydrogen in the SiN film and minimize deleterious effects upon device performance caused by stress and hydrogen. The thickness of the metal passivation layer may be the same as that of the dielectric layer so as to give a planar surface or it may be thick enough so as to give a protruding metal passivation bump.

12 Claims, 7 Drawing Sheets

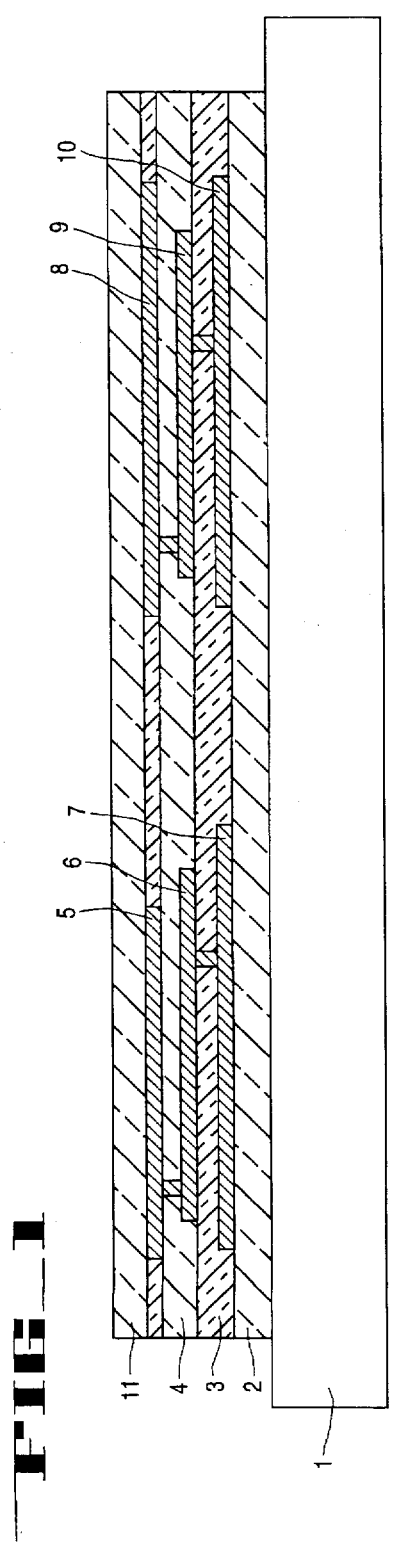
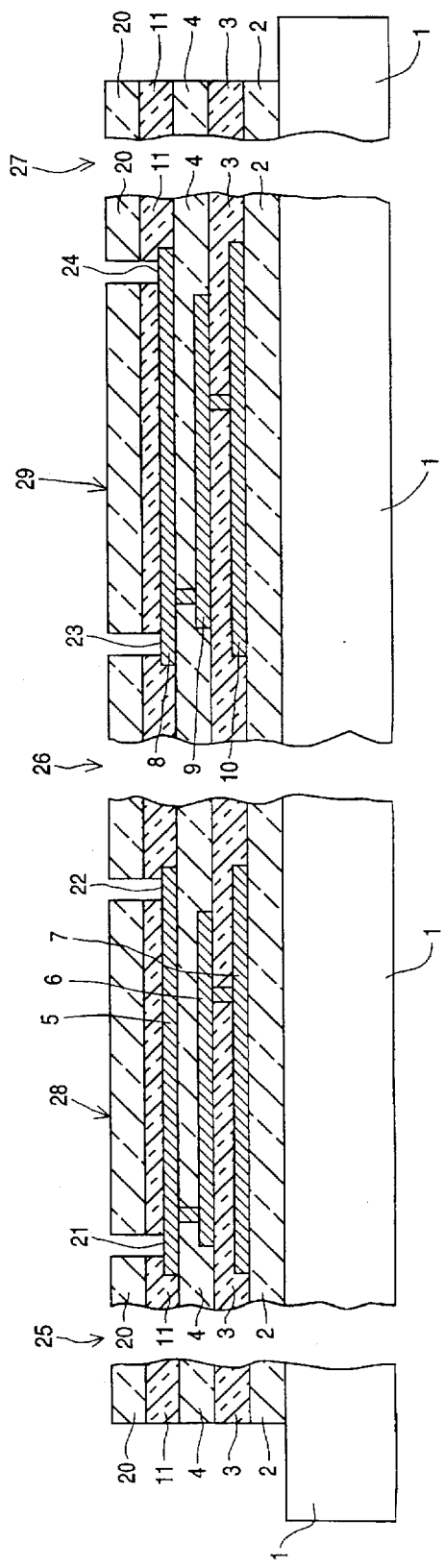
FIG._1
FIG._2 (PRIOR ART)

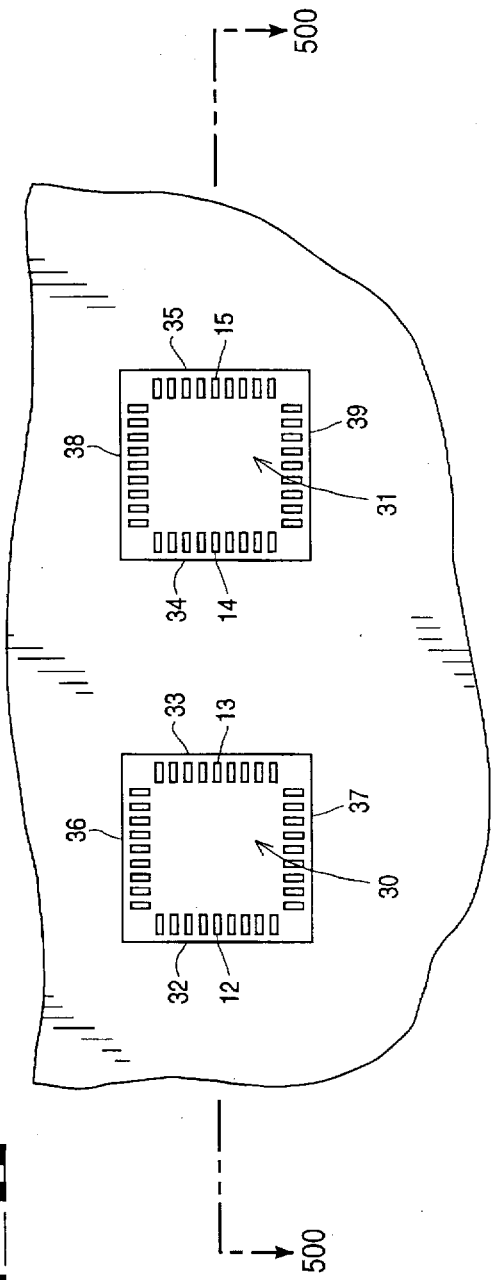
FIG_3
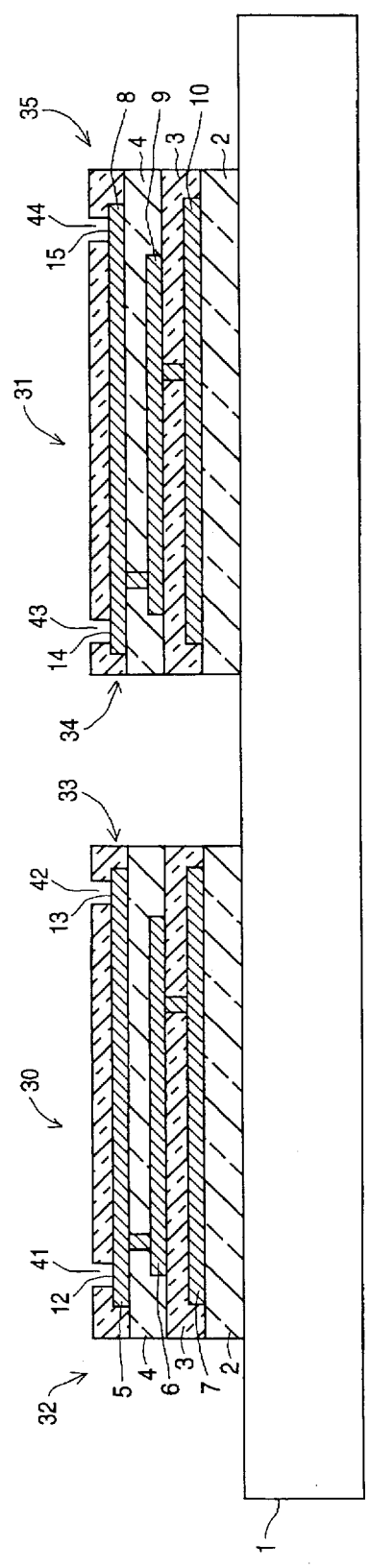
FIG_4

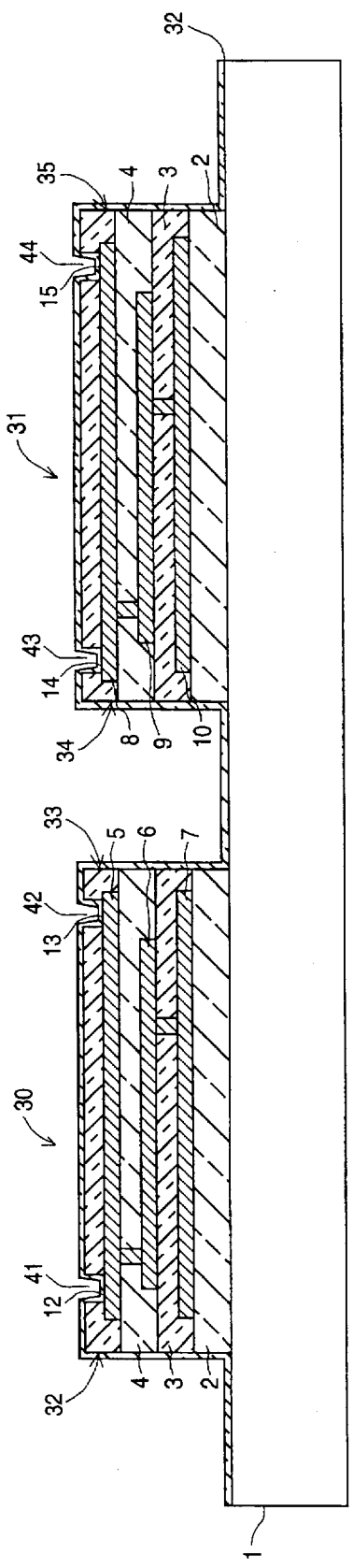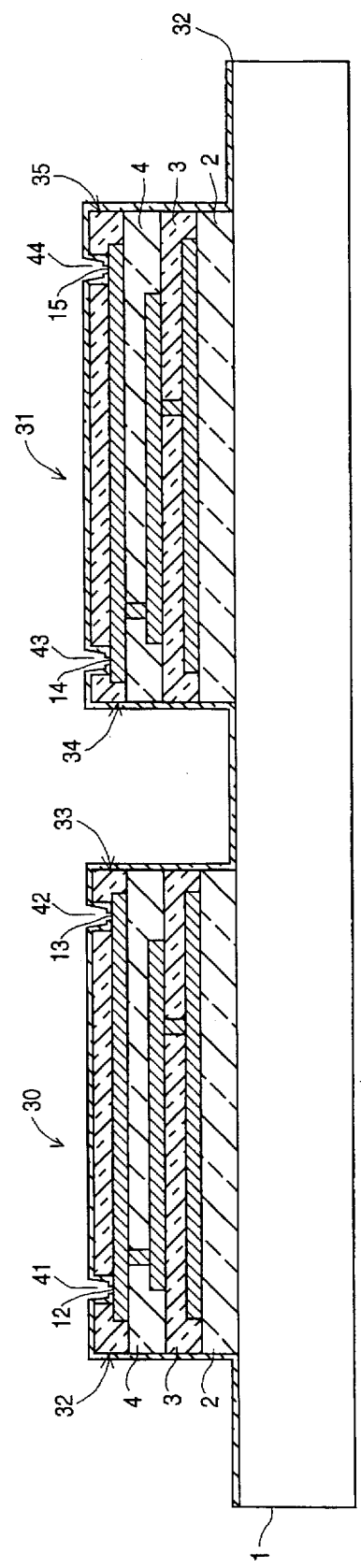

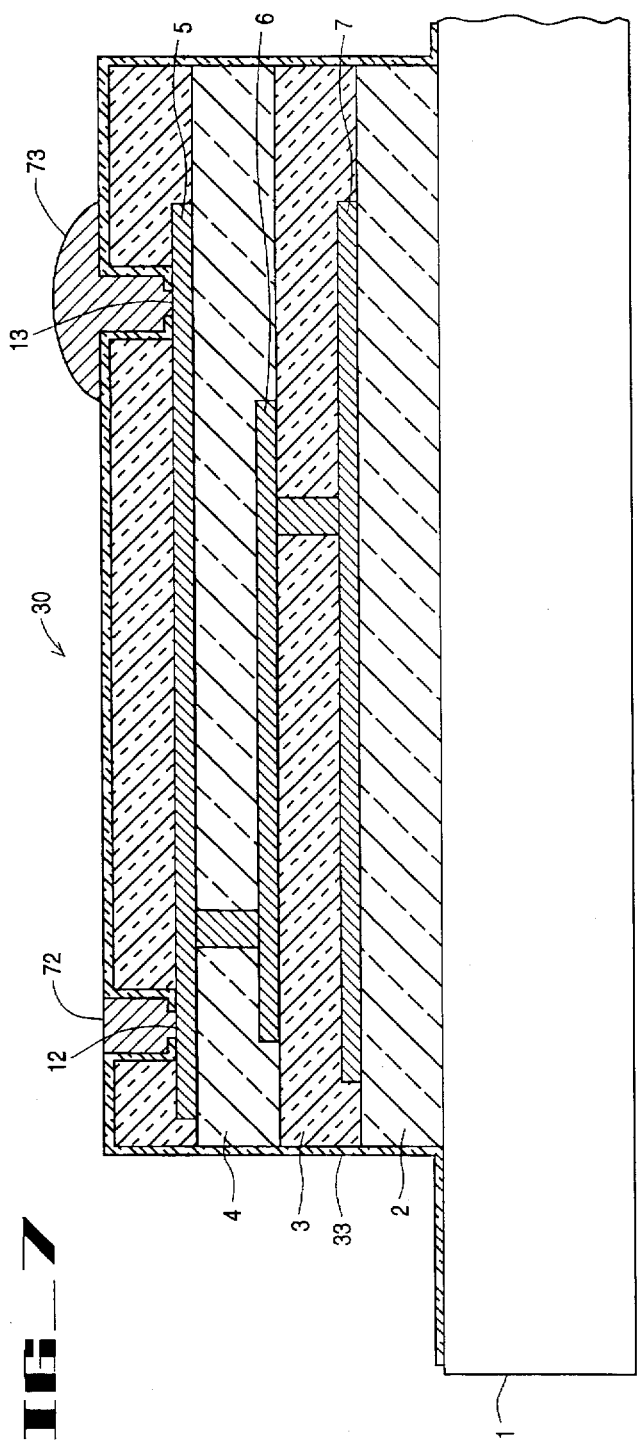
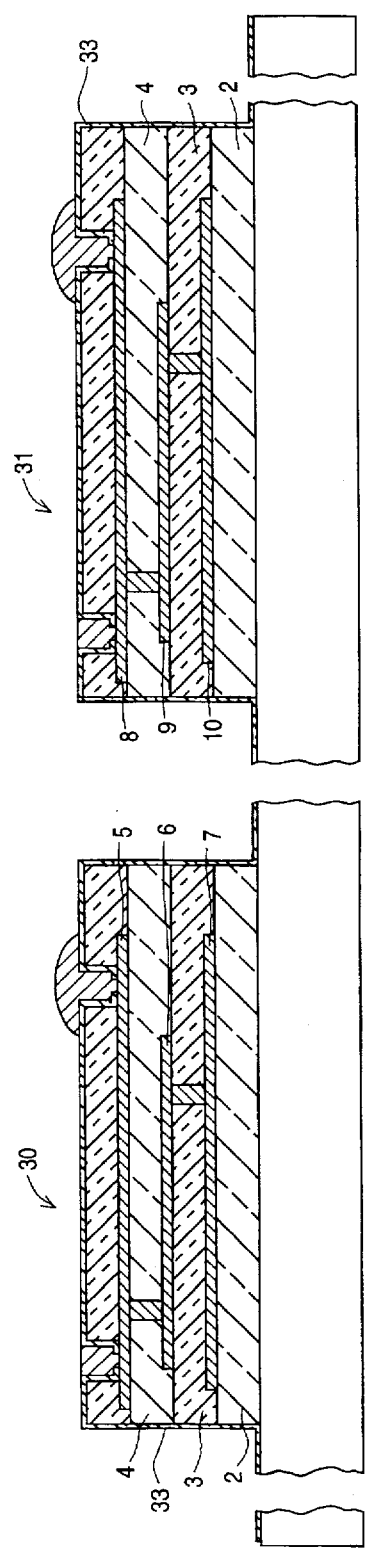
FIG_7
FIG_8

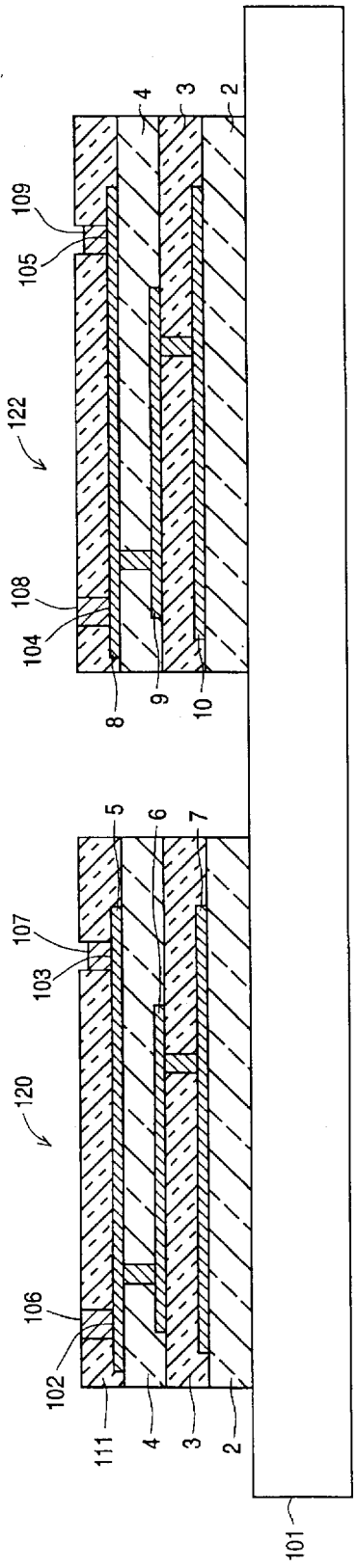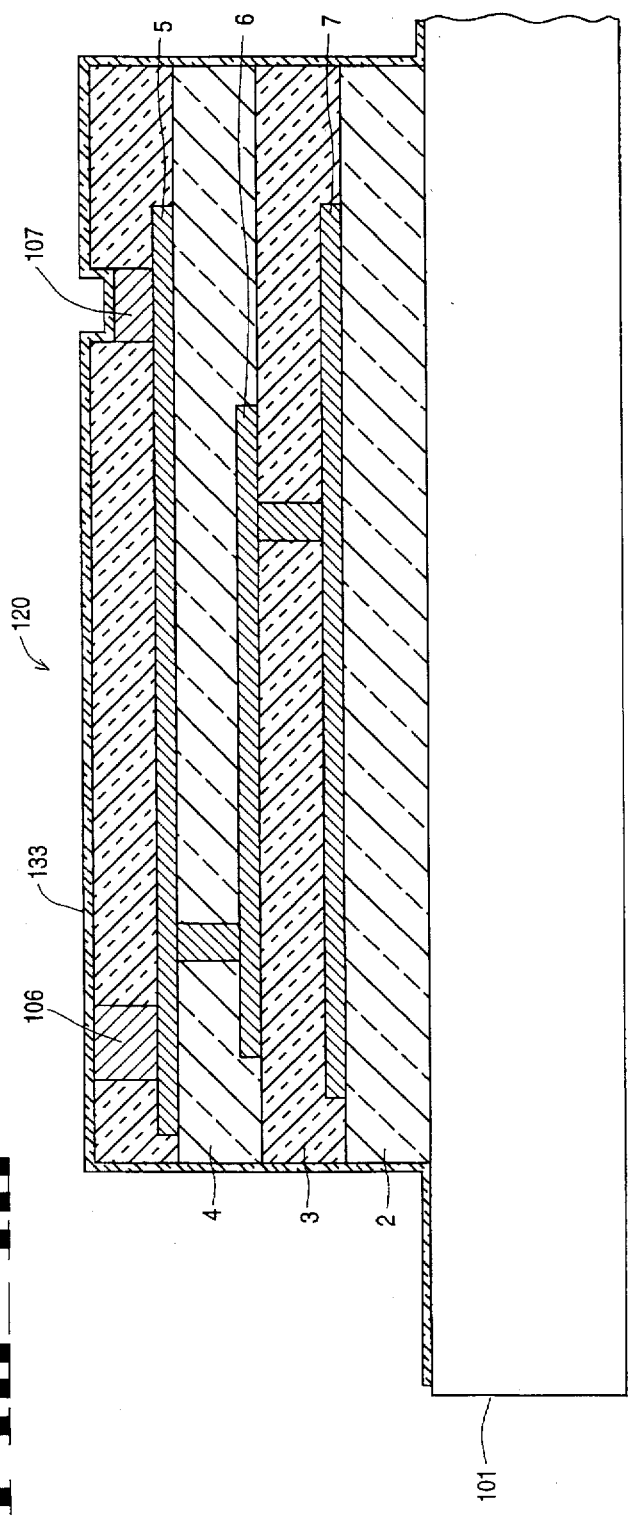

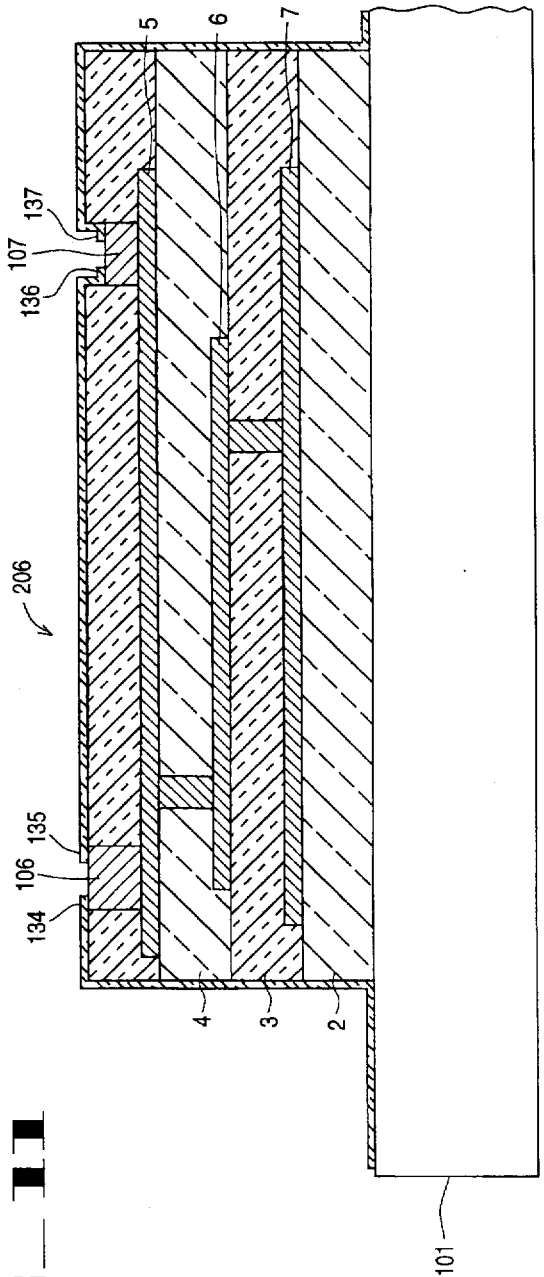
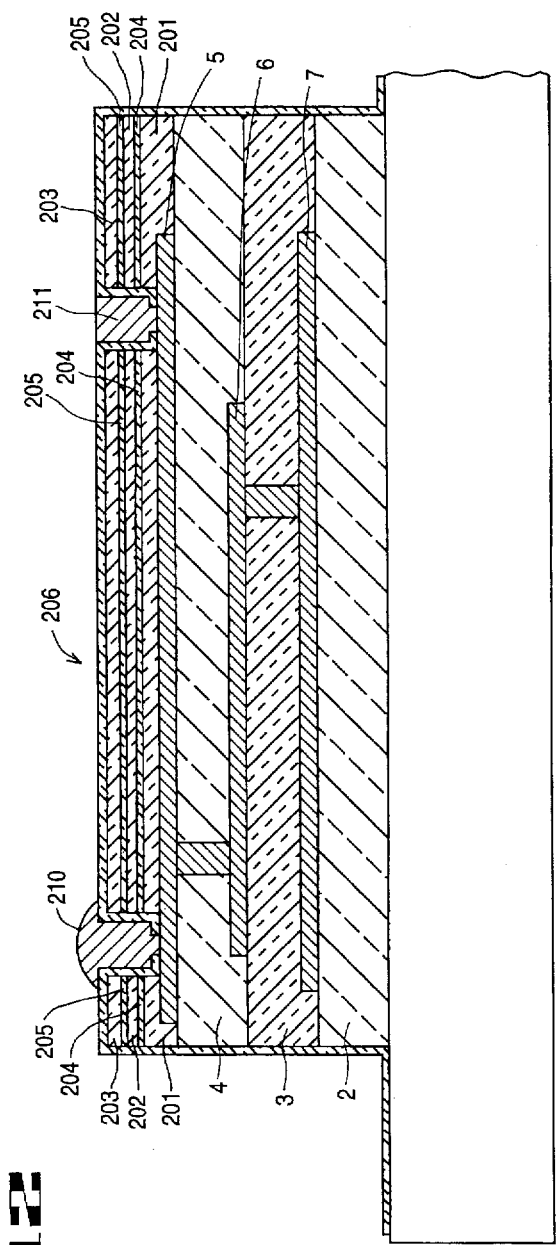
FIG_11
FIG_12

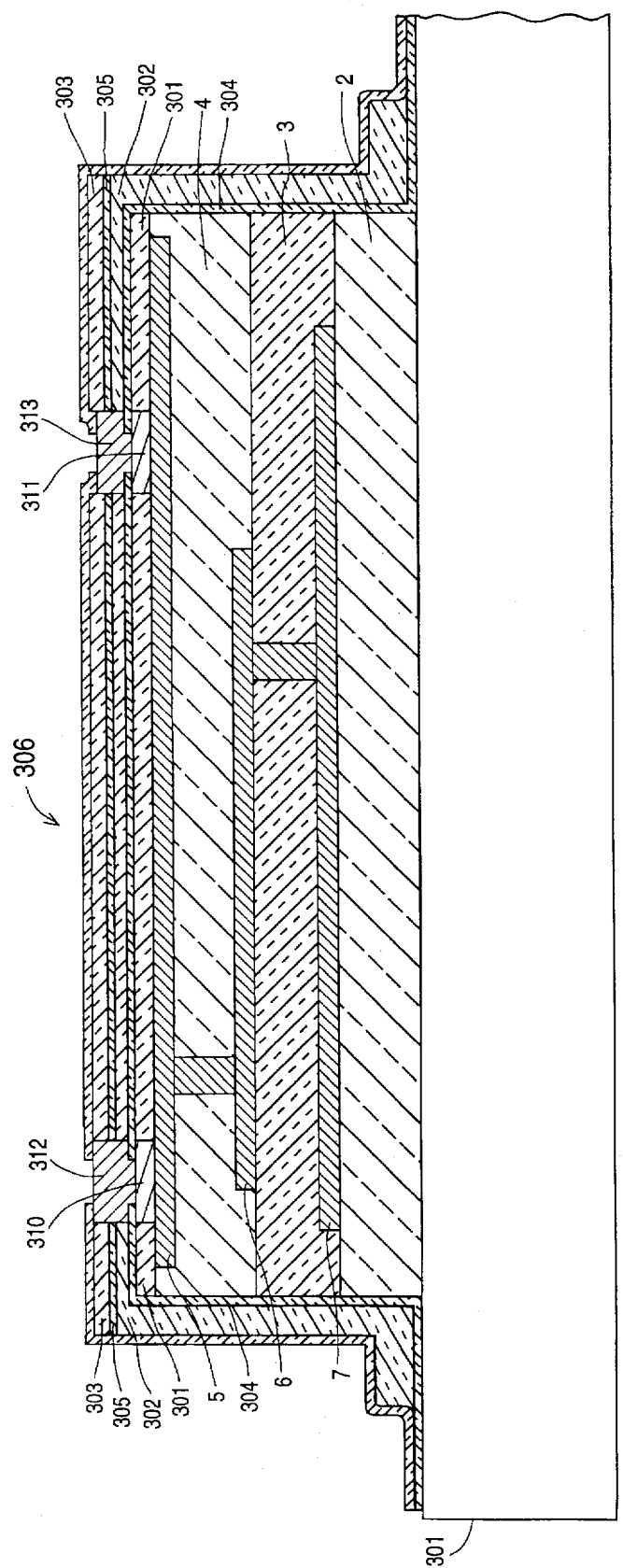

SEALED SEMICONDUCTOR CHIP

This is a continuation of application Ser. No. 08/138,956, filed Oct. 19, 1993 and now abandoned, which is a divisional of application Ser. No. 08/008,469, filed Jan. 25, 1993, now U.S. Pat. No. 5,300,461.

FIELD OF THE INVENTION

This invention relates to the field of semiconductor devices and more specifically to a process forming a sealed semiconductor chip.

PRIOR ART

Prior art methods of sealing semiconductor devices involve the use of a thick layer of silicon nitride (SIN) to seal the dielectric layers of the semiconductor device. These layers are formed upon the Si substrate by methods well-known to those skilled in the art. These prior art methods typically seal the top surface of the dielectric layers by using a thick SiN layer. Thus, they do not cover the bonding pads. The bonding pads, therefore, are not protected. Additionally, the sides of the chip are not protected. Current VLSI semiconductor devices typically use hermetically sealed packages such as ceramic pin-grid-array packages to protect semiconductor devices. The ceramic packages are very large, heavy, and costly and limit the operating speed of devices. Past effort in reducing the size and cost of IC packages have resulted in the introduction of a variety of new packaging configurations such as: small outline package (SOP), very small outline package (VSOP), thin small outline package (TSOP), and very small quad flat packs (VQFP), etc. This trend in developing new and smaller packages will continue. However, the best possible situation is to completely eliminate the package so that the cost, size and speed of the integrated circuits will be limited entirely by the chip itself. This "bare-chip" approach will require a "bullet-proof" passivation on chips to protect them from harmful contaminants in the environment. This specification describes the structures and processes that are needed to provide the required "bulletproof" chip passivation.

For passivation layer applications, silicon nitride is generally deposited by using a PE-CVD process because thermal CVD processes require a temperature too high for aluminum (Al) metallization. However, unlike SiN deposited by thermal CVD process, SiN films deposited by PE-CVD process, have very high stress and high hydrogen content. The high hydrogen content in the film, often more than 20%, causes the film to be thermally unstable because it will release hydrogen during subsequent thermal cycles. Therefore, there has been much effort to improve the film properties by optimizing deposition conditions such as deposition temperature, pressure, gas flow rate, plasma power, etc. What is needed is a process which will minimize the H-content in the deposited films.

Another disadvantage of prior art methods which involve the use of a thick SiN passivation layer is that the thick layer creates a high stress within the dielectric layers. Stress migration is caused in device interconnects which leads to device degradation and failure. The combination of high-stress and high H-content of thick nitride layers can cause void formation in the underlying Al lines which leads to stress migration failures. The released H can work all the way down to the device region to generate charge trapping centers in the gate oxide. These trapped charges will cause changes in the threshold voltage and decreases in the transconductance of the devices. The degradation in device characteristic is especially important under high field stress conditions and is often referred to as the hot electron effect. What is needed is a method for sealing semiconductor devices that will avoid the above-described problems.

Prior art methods for producing both volatile and non-volatile memory products require the use of different types of passivation materials for the different products due to limitations of the materials used. There are three dielectric materials which are in common use as semiconductor chip dielectric materials and which can be used for chip passivation. These materials include silicon dioxide ($SiO_2$), silicon oxynitride (SiON) and silicon nitride (SiN). In non-volatile memory products SiON is typically used for a passivation layer. $SiO_2$ has poor moisture resistance. Therefore, due to its poor moisture resistance properties, current processes do not use $SiO_2$ for chip passivation. SiON is generally used for forming dielectric layers and for passivation of non-volatile memory products since it is UV transparent. Although SiON is a better moisture barrier than $SiO_2$, it gives a relatively poor moisture barrier. SiN, however, is an excellent moisture barrier. Thick layers of SiN are typically used in fabricating a number of semiconductor devices. But thick layers of SiN, as used in prior art processes are not transparent to UV light; therefore, SiN could not be used for non-volatile memory product fabrication. What is needed is a way to make a passivation layer from SiN which will allow for the passage of UV light so that non-volatile memory products can use SiN as a passivation material. This would greatly simplify manufacturing processes as SiON processes and process machinery would no longer be required. Furthermore, sealed-moisture resistant non-volatile memory products could then be fabricated.

Conventional VLSI fabrication methods use bonding pads to provide electrical connections between the chip and external devices such as the chip packages or multi-chip substrates. Typically, bonding pads are made of Aluminum though any of a number of other conductive materials could be used. Bonding pads are formed by etching a portion of the passivating layer and the dielectric layer so as to expose a portion of an interlevel metal layer which is typically composed of Al. This exposed portion of the interlevel metal layer defines the bonding pad. Since the etch step etches the passivation layer, the Al bonding pads are not protected by the passivation layer. Moisture and chlorine from the environment and the etching process are known to cause corrosion of the Al bonding pads when those pads are placed in non-hermetic packages. A method is therefore required to protect the Al bonding pads.

Conventional VLSI processes directly bond Au or Al wires to the aluminum bonding pad. Alternatively, Pb—Sn solder bumps are used to connect to the aluminum bonding pads. One of the problems with the use of Pb—Sn solder on Al bonding pads is that inter metallic compounds may be formed at the boundary of the Pb—Sn solder and the Al. These inter metallic compound are often formed due to the elevated temperatures which are used in chip packaging processes. To prevent this formation of inter metallic compounds, an elaborate diffusion barrier structure consisting of a Cr—Cu—Au multilayer is often used between solder bump and Al bonding pad. This process is expensive and time consuming. The formation of inter metallic compounds can cause a poor electrical contact and can lead to contact erosion and eventual device failure. What is needed is a method for connecting bonding pads to leads which can use the traditional Pb—Sn solder, and which will not form inter metallic compounds.

Other processes which are currently used to connect leads to aluminum bonding pads are TAB processes. First, additional barrier layers are formed over the Al pad. Gold bumps are then formed on top of the additional barrier layers. The gold bumps are then used to bond the leads to the aluminum. The additional barrier layers, in the same manner as the Cr—Cu—Au multilayer, prevent the formation of inter metallic compounds. The problem with the use of conventional diffusion barrier layers is that additional wafer processing steps are required. These processing steps on the already completed device wafer present a great risk of damaging the chip. What is needed is a method for bonding leads to bonding pads which eliminates the formation of inter metallic compounds at the boundaries of the different metals, and which is compatible with TAB, Pb—Sn solder, and lead attachment methods.

Current semiconductor processes use a sawing process to divide the Si substrate upon which dielectric layers have been formed into a number of chips. Present VLSI processes currently include the deposition of a thick passivation layer over the dielectric layer. Though to some extent this layer protects the top of the chip, the sawing process opens the sides of the chip and thereby exposes the chip to moisture and other contaminants. What is needed is a passivation method for forming semiconductor devices in which the sawing process will not open the sides of the chip to moisture or other contaminants.

SUMMARY OF THE INVENTION

The present invention describes a process for passivation of semiconductor devices to protect those devices from environmental moisture and contaminants. Si is impervious to moisture at typical device operating temperatures. Therefore, it is not necessary to form a hermetic seal over the Si substrate. Thus, it is only necessary to passivate the exposed dielectric layers and the bonding pads.

A novel bonding pad passivation method is described which incorporates the use of selectively deposited metal, such as electroless Ni or Ni alloy. Not only does this Ni or Ni alloy act as a passivation material, but it also acts as diffusion barrier against inter metallic compound formation between Al and Au or Pb—Sn solder. Thus, the present passivation method eliminates the need for elaborate Cr—Cu—Au multilayers required by convention bonding processes.

In the preferred embodiment of the present invention a bonding pad passivation layer is formed of Ni or Ni alloy. Pb solder bumps can then be directly formed on the Ni surface. For example, these solder bumps may be formed by simply dipping the Ni passivated chip or wafer directly into a pot of molten solder. The molten solder will automatically wet the Ni surface to form solder bumps; thus greatly simplifying the bonding process. The barrier properties of the passivation layer can also be advantageous when the wire bonding and TAB process are used. Gold bumps are conventionally used to bond the tape and the wires to the Al pads. Gold bumps can be directly formed on the nickel surface. For example, gold bumps may be directly deposited in the Ni surface by the use of a wire bonder, additional wafer processing steps are not required. Thus, the use of a Ni bonding pad passivation layer as described in the present invention not only protects the bonding pad from corrosion and contamination but it also overcomes many of the problems associated with prior art bonding processes.

A method for chip surface passivation is also described. A SiN passivation layer having a greatly reduced thickness as opposed to thicknesses of current typical passivation layers is used. A very thin film of SiN film, having a thickness of approximately 500 angstroms is used for passivation layer. Alternatively, multiple layers of thin SiN films can be used by sandwiching them in between thicker SiO2 layers. The thin film overcomes many of the problems associated with prior art thick films. This thin film is highly resistant to moisture, thus giving very effective passivation. The thin film described in the present invention has a significantly reduced stress and H content as opposed to thicker prior art films.

The present method for forming a sealed chip incorporates both bonding pad passivation and chip surface passivation. Though each method may practiced separately, the incorporation of both methods allows for the creation of a superior sealed chip. By using both methods a superior seal is formed over the entire surface of the semiconductor chip. Furthermore, by using both methods multiple layers of chip sealant may be deposited so as to form chips having multiple sealing layers for use in harsh environments.

A method for chip surface passivation is described for forming sealed, moisture resistant chips for non-volatile memory products. The passivation layer of these chips will be formed by a SiN layer which will allow the penetration of UV light. The formation of a SiN film which will allow the penetration of UV light is achieved through the deposition of a thin film of SiN by depositing the film at a high ion bombardment levels at low temperatures using a PE-CVD deposition method.

The passivation layer covers not only the top of the semiconductor chip, but also, it covers the sides of the semiconductor chip and a portion of the silicon substrate top surface. This is achieved by etching the device layers so as to form individual chips upon the silicon surface. Then the passivation layer is deposited so as to cover the top and sides of each chip as well as the exposed silicon surface. Since the silicon substrate is resistant to moisture, this forms a moisture-resistant coating over the entire chip surface.

Semiconductor integrated circuits are first formed on a silicon wafer by the successive formation of a number of device layers composed of conductive layers and dielectric layers. The process steps for forming integrated circuits include the formation of a number of bonding pads. These bonding pads are typically formed of aluminum or its alloys. Mask and etch steps are then performed which isolate individual integrated circuit devices formed upon the wafer surface. This is done by performing etch steps which completely etch the device layers so as to expose portions of the silicon surface. The etch steps thus form and define a number of semiconductor chips upon the silicon layer. Next, a thin SiN film is deposited over the surface of each chip and the wafer surface. The passivation layer will form a seal over the entire chip surface including the top of the Si surface, the sides of the device layers and the bonding pads. Next, mask and etch steps are performed so as to expose a portion of the metal of the bonding pad. Bonding pad passivation is then performed by selectively depositing a layer of Ni or Ni alloy over the bonding pad. The metal passivation layer may be deposited so as to form a planar upper surface. However, a superior seal may be formed by depositing the bonding pad passivation layer so as to form protruding metal passivation layer bumps. By using protruding metal passivation bumps, a better seal may be formed over the opening containing the bonding pad.

In a second embodiment of the present invention, the metal passivation layer is deposited prior to deposition of the SiN passivation layer. In this embodiment, the SiN passivation layer seals the entire surface of the chip, including the Si wafer surface and the metal passivation layer. A subsequent etch step exposes the passivation metal for bonding.

A third embodiment of the present invention incorporates multiple SiN passivation layers separated by other layers. These other layers may be layers of dielectric. These multiple layers could be integrated with multiple layers of metal passivation to form a chip which has a superior seal for use in harsh environments.

In each of the above described embodiments the chips must be separated from each other. This is typically done by a mechanical sawing process. In the preferred embodiment of the present invention the wafer is sawed so that only the silicon surface itself and the SiN passivation layer is sawed. Therefore, the dielectric layers and conductive layers which overlie the Si substrate are not exposed by the sawing process. The end result is a semiconductor chip which is sealed by the dielectric passivation layer on all exposed portions of the chip, except for the Si substrate. Since the passivation layer forms a seal upon the top Si surface and since the Si substrate is impervious to moisture at device operating temperatures, a completely hermetically sealed semiconductor chip is created.

BRIEF DESCRIPTION OF THE DRAWINGS

FIG. 1 is a cross-sectional view of a semiconductor wafer upon which various conductive layers and dielectric layers have been formed.

FIG. 2 is a cross-sectional view of a semiconductor wafer illustrating the prior art method for forming computer chips.

FIG. 3 is a top view of a semiconductor wafer upon which conductive layers including interlevel metal layers, and dielectric layers have been formed and etched.

FIG. 4 is a cross-sectional view of a semiconductor wafer along axis 500—500 upon which conductive layers including interlevel metal layers, and dielectric layers have been formed and etched.

FIG. 5 is a cross-sectional view of a semiconductor wafer having the structure shown in FIG. 4 after deposition of a SiN passivation layer.

FIG. 6 is a cross-sectional view of a semiconductor wafer having the structure shown in FIG. 5 after the etch of the SiN passivation layer.

FIG. 7 is an enlarged cross-sectional view of the left side of a semiconductor wafer having the structure shown in FIG. 6 after the selective deposition of a metal passivation layer.

FIG. 8 is a cross-sectional view of a semiconductor wafer having the structure shown in FIG. 7 which illustrates the sawing step.

FIG. 9 shows a cross-sectional view of a second embodiment of a semiconductor wafer along axis 500—500 after mask and etch steps have defined individual chips and after the selective deposition of a metal passivation layer over the bonding pads.

FIG. 10 shows a cross-sectional view of the semiconductor wafer of FIG. 9 after the deposition of a thin silicon nitride passivation layer.

FIG. 11 shows an enlarged view of the left semiconductor chip illustrated in FIG. 10 after the etch of the silicon nitride passivation layer.

FIG. 12 shows a third embodiment which illustrates a semiconductor chip having multiple passivation layers FIG. 13 shows a fourth embodiment which illustrates a semiconductor chip having multiple passivation layers.

DETAILED DESCRIPTION

1. Apparatus And Process For Forming A Sealed Chip

An invention is described for a sealed chip and a process for forming a sealed chip. The sealed chip will provided reliable protection for advanced VLSI chips without the need for expensive and complicated hermetically sealed packages, and will reduce the cost, weight, and size of the final product. The method and apparatus described is compatible with all standard assembly technologies such as wire bonding, solder bumping, and tape automated bonding (TAB). Furthermore, when used with solder bumps and tape automated bonding, the present invention can dramatically simplify the assembly process.

In the following description, numerous specific details are set forth such as specific thicknesses, materials, and specific deposition processes, etc. in order to provided a thorough understanding of the present invention. It will be obvious, however, to one skilled in the art that the present invention can be practiced without these specific details. In other instances, well-known process steps have not been described in detail in order not to unnecessarily obscure the present invention.

Presently, semiconductor integrated circuits are manufactured by the deposition and etch of a number of layers upon a silicon (Si) wafer. For example, device regions are formed within the Si wafer. Layers of conductive and non conductive material are then deposited over the device regions, masked and etched to form semiconductor devices. These devices are then connected by the use of conductive layers. These conductive layers are typically metal layers which are deposited, masked and etched to form interconnects. Subsequent layers are formed so as to define additional devices and interconnects. Though the present invention is described with reference to the use of metal layers, one with skill in the art would realize that a number of other conductive materials could be used to form conductive layers. A top dielectric layer is then typically deposited over the top conductive layer to planarize and insulate the electrical devices and interconnects. FIG. 1 shows a typical cross-section of a semiconductor wafer which incorporates this technology. This figure illustrates the Si wafer 1 upon which dielectric layers 2, 3 and 4 have been formed by methods well-known in the art. The figure shows three metal layers which have been deposited, masked, and etched to form metal layers 5–10. Metal layers 5–10 overlie device regions so as to connect the various devices and the subsequently deposited metal layers. A layer of dielectric is then deposited over the top conductive layer to planarize the upper surface and to prevent the leakage of electrical current through the passivation layer. FIG. 1 shows top dielectric layer 11 deposited over the semiconductor surface. Typically, a large number of integrated circuit devices are formed upon any semiconductor wafer. For example, in this illustration, dielectric layers 2, 3, 4, and 11 and metal layers 5, 6 and 7 would be part of an integrated circuit device which is separate from a second integrated circuit device which comprises metal layers 8, 9 and 10, the dielectric layers 2, 3 and 4, and 11.

FIG. 2 shows the prior art method for formation of a semiconductor chip. In this prior art method the integrated circuit devices formed on the wafer surface are separated by a sawing process. This sawing process cuts the silicon substrate and all of the overlying layers to form a number of chips, each of which includes an integrated circuit device. FIG. 2 shows integrated circuit devices illustrated in FIG. 1 over which thick passivation layer 20 has been deposited. Current VLSI chip processes use a thick layer of sealant as a passivation layer. This thick layer is typically 1 μm or greater in thickness. An etch step is then performed to form openings in the thick passivation layer and the top dielectric layer 11 which expose bonding pads. FIG. 2 shows bonding pads 21–24 defined by openings in top dielectric layer 11 and thick passivation layer 20. Saw cuts 25 and 26 isolate the integrated circuit device comprising dielectric layers 2, 3 and 4, metal layers 5, 6, and 7, and dielectric layer 11 so as to form computer chip 28. This computer chip may be connected to outside devices, power sources, etc. by contact made to bending pads 21 and 22. Saw cuts 26 and 27 isolate a second insulated circuit device comprising dielectric layers 2, 3 and 4, metal layers 8, 9, and 10, and dielectric layer 11 so as to form computer chip 29.

Though the sawing step does isolate the device layers so as to form two separate chips, the sides of the chips will be rough, non-uniform, and susceptible to damage due to moisture and other contaminants entering through the exposed side edges of the chip. Current methods for protecting the chip and hermetically sealing the chip involve placing the chip into a package which performs the function of protecting and sealing the sides of the chip. Hermetically sealed packages such as ceramic pin grid packages typically are used to protect the chips. These packages are large, bulky and expensive. An additional disadvantage associated with prior art process is the fact that the thick SiN passivation layer puts underlying layers under a high stress which causes stress migration in the interconnects. Furthermore, the deposition of the thick layers of SiN forms a significant amount of hydrogen (H) which causes device degradation.

The present invention avoids many of these problems by isolating and passivating each chip before the sawing of the silicon wafer. FIG. 3 illustrates a semiconductor wafer upon which integrated circuit devices have been formed and isolated by the methods of the present invention. Computer chips 30 and 31 are shown to be formed upon the silicon substrate 1. Each of the computer chips which are formed on the silicon substrate 1 will contain a large number of bonding pads such as bonding pads 12 and 13 which are formed on computer chip 30. Side surfaces 32, 33, 36 and 37 which are formed by the etch steps described below isolate the computer chip 30. Similarly, computer chip 31 is isolated by side surfaces 34, 35, 38 and 39.

First, an etch step is performed so as to isolate each of the integrated circuit devices. This step will etch each of the dielectric layers 2–4 and the top dielectric layer 11 so as to expose a portion of the surface of the Si substrate 1. This etch need not be a separate etch step requiring an additional process step since the etch can be performed during typical wafer processing etch steps. Though the figure illustrates the use of a single etch, the preferred embodiment of the present invention would use a number of standard processing etch steps to define the scribe lanes and side surfaces 34–39. Preferably, as each successive device layer is etched during standard chip processing, the scribe lanes and the sides of the chip are simultaneously etched. The etch step illustrated in FIG. 4 shows side surfaces 32 and 33 which isolate the computer chip 30 and the integrated circuit device which is formed therein. The etch step has also formed side surfaces 34 and 35 which isolate the computer chip 31 and the integrated circuit device formed therein. This etch step or a separate etch step will form openings in the top dielectric layer 11 so as to expose and define bonding pads. FIG. 4 shows bonding pad openings 41–44 formed by this etch. Of course, the side surfaces 34 and 35 need not be vertical. Though side surfaces 34 and 35 are shown to be vertical, they may also be sloped. In fact, the use of sloped side surfaces formed by a number of successive standard etch steps may give a more effective seal as improved step coverage may be obtained for the SiN layer.

Next, a layer of passivation material is deposited over the wafer surface. FIG. 5 illustrates the structures shown in FIG. 4 after passivation layer 40 has been deposited over the entire wafer surface. In the preferred embodiment of the present invention, a very thin layer of SiN is used as a passivation layer to seal the computer chip. In the preferred embodiment of the present invention, this passivation layer is approximately 1000 angstroms or less. Though the present invention uses SiN, other compatible materials which are moisture resistant may be used to form a sealed chip. Though the structure of the present invention may be formed by the use of other moisture resistant films, the preferred embodiment uses a thin film made of SiN. This film is used because of its excellent moisture resistant qualities and its good step coverage. Furthermore, the use of a thin SiN film minimizes H-content and stress related problems.

One object of the present invention is the formation of a sealed chip having a passivation layer which is moisture resistant and which is UV transparent. Prior art thick layers of silicon nitride are not transparent to UV light. Currently, non-volatile memories do not use PE-CVD nitride as a passivation layer because UV light with a wave length centered around 250 nm is used in EPROM for erasing and in FLASH memory for initialization. For this reason SiON is typically used for a passivation layer in non-volatile memory products. PE-CVD SiON is made UV transparent by properly adjusting the O/N ratio. SiON is, however, not as good a passivation layer as SiN as it is less moisture resistant. It has been reported recently that the UV absorption in PE-CVD SiN is primarily due to its high H-content. More specifically, it is due to high concentration of Si—H bonds. Since Si—H bonds are weaker than N—H bonds and Si—N bonds, the concentration of Si—H bonds can be minimized by either increasing the temperature or ion-bombardment during the deposition process. The present invention forms a UV transparent SiN film by using higher ion-bombardment during the PE-CVD nitride deposition process and by depositing a thin film. By this process, UV transparent nitride films can be deposited at low temperatures. The preferred embodiment of the present invention uses an SiN film thickness of approximately 500 angstroms (Å). By using high ion-bombardment in the deposition process and a very thin layer, the SiN passivation layer will be transparent to UV. For example, a thin SiON film which is UV transparent may be deposited by using a temperature of 390° C., a pressure of 8 torr, and a plasma level of 700 watts in a single wafer reactor. This will allow non-volatile memory products to use PE-CVD nitride layers for passivation. This will not only give a better passivation but also eliminate a major difference in processing requirements between logic products and memory products. This compatibility should result in further simplification of product development and manufacturing processes.

In this embodiment, the SiN passivation layer directly overlies the bonding pad surfaces. Note that the bonding pads 12–15 have been completely covered by SiN passivation layer 40. These bonding pads are typically formed of aluminum. A hermetic seal is formed at the interface of the aluminum and the SiN passivation layer. The passivation layer also forms a hermetic seal over the sides 32–35 and the upper surfaces of the integrated circuit devices 30 and 31. This layer will also protect and seal the sides of the bonding pad openings 41–44. The passivation layer will also overlie portions of the surface of the Si wafer 1 forming a hermetic seal along the interface where the SiN surface overlies the top surface of the Si wafer 1. Thus, a hermetic seal will be formed which completely encloses each of the integrated circuit devices.

Next, mask and etch steps are performed so as to form openings within the SiN layer to expose portions of the bonding pads. FIG. 6 illustrates the structure of FIG. 5 after the mask and etch steps have exposed portions of each of the bonding pads 12–15. The etch step preferably leaves a sufficient amount of SiN overlapping the bonding pad so as to seal the bonding pad. The layer of SiN which overlies the bonding pad surface forms a hermetic seal at the interface between the SiN and the Al bonding pad. Thus, though each of the bonding pads 12–15 are exposed, there remains a hermetic seal so as to prevent moisture from entering at the bonding pad.

Though it would be possible at this juncture to attach leads to the exposed portions of the bonding pads, it is desirable to further protect the bonding pads as the aluminum material from which bonding pads are currently made is subject to corrosion. In the preferred embodiment of the present invention a non-corrosive material is used to protect the bonding pads and to further seal the silicon chip. Any number of conductive materials could be used to passivate the bonding pad. In particular, metals such as electroless Ni, Co, Pd or Au may be used to seal the bonding pads. In the preferred embodiment of the present invention, Ni or Ni alloy is used to protect the bonding pads. Preferably, electroless Ni is selectively deposited over the bonding pad surface.

FIG. 7 shows an expanded view of the structure of chip 30 of diagram 6 having a Ni passivation layer selectively deposited over the bonding pad surfaces. A hermetic seal is obtained at the interface of the SiN and the Ni which further acts to seal the integrated circuit device. At the interface between the Ni passivation layer 72 and Al bonding pad 12, both an electrical connection and a hermetic seal is achieved. The passivation metal layer 72 is deposited so that it is flush with the top surface of the passivation layer 33. However, it may desirable to form a metal passivation layer which extends above the top surface of the integrated circuit device. Metal passivation layer 73 is an example of a metal passivation layer which extends over the top surface of passivation layer 33 so as to form a metal passivation bump. While a very good seal may be maintained by metal passivation layer 72 as a seal is formed at both the bottom and on the sides of the opening for the bonding pad, the use of an overlapping metal passivation layer as shown by metal passivation layer 73 creates an additional portion of the upper surface which is hermetically sealed. Thus, creating a superior seal. Furthermore, the configuration in which the metal passivation layer extends above the top surface of the passivation layer 33 provides a superior surface for attachments of leads. For illustration purposes the semiconductor chip 30 is shown to have both a flush metal passivation layer and a metal passivation layer which extends over passivation layer 33, however, it would be preferable to have only one type of passivation layer formed over each bonding pad for ease of manufacture. Furthermore, though the present invention describes the selective deposition of a layer of Ni, the same structure could be achieved by the non-selective deposition and subsequent etch of a layer of Ni. The present invention is described with reference to a chip isolation method, a SiN passivation layer and a metal passivation layer. Though these methods may be practiced separately, the combination of isolation of individual chips by a series of etch steps in conjunction with the use of both a SiN passivation layer and a metal passivation layer gives a superior passivation enclosure.

Next, the wafer is sawed to separate the various semiconductor chips. FIG. 8 illustrates the sawing of the wafer surface. Note that the upper surface and sides of the integrated circuit device 30 are completely sealed by the passivation layer 33 both before and after the sawing process. The sawing of the wafer surfaces is performed such that the hermetic seal between the passivation layer 33 and the top surface of the silicon substrate 1 is maintained where the passivation layer 33 directly overlies the Si substrate surface. Similarly, silicon chip 31 is hermetically sealed by the passivation layer 33 where it directly overlies the Si substrate surface.

FIG. 9 illustrates a second embodiment of the current invention in which the metal passivation layer is selectively deposited prior to deposition of the SiN passivation layer. First, etch steps are performed so as to isolate each of the semiconductor chips and to expose each of the bonding pads. Next, a passivation metal layer is selectively deposited so as to overlie each of the bonding pad surfaces. FIG. 9 illustrates silicon substrate 101 having semiconductor chips 120 and 122 formed thereon. The figure shows a top dielectric layer 111 which has been etched so as to expose bonding pads 102–105. Passivation metal layers, 106–109 are shown to be deposited over each of the bonding pads 102–105. The passivation metal layer may be deposited either flush with the top surface or it may be deposited so that it does not fill to the top surface of the top dielectric layer 111. For illustration purposes drawing 9 shows both flush and non-flush metal passivation layers. One with skill in the art would realize that it would be preferable to have all bonding pads either flush or non-flush. Bumps could also be used. Bonding pad 102 is completely covered by metal passivation layer 106, so as to form an electrical contact between the metal passivation layer 106 and the bonding pad 102. The metal passivation layer 106 also acts to seal and enclose the exposed dielectric which forms the side surfaces of the bonding pad opening in the top dielectric layer 111. Alternatively, the metal passivation layer may be deposited so that it has a height less than the height of the top of the passivation material. This configuration is shown by passivation layer 107 which overlies and which electrically contacts bonding pad 103. Similarly, integrated circuit device 122 is shown to have bonding pads 104 and 105 upon which metal passivation layers 108 and 109 have been deposited.

Next, a SiN passivation layer is deposited over the entire semiconductor surface. FIG. 10 illustrates an expanded view of semiconductor chip 120 after deposition of SiN passivation layer 133. The passivation layer will form a seal over metal passivation layers 106 and 107. The SiN passivation layer 133 not only seals and encloses the metal passivation layer 106, but also seals that portion of top dielectric layer 111 which forms the side walls of the bonding pad opening, and which overlies the metal passivation layer 106. As in the previous embodiment, the sides of the integrated circuit device, the top, and the silicon top surface is hermetically sealed.

Next, mask and etch steps are formed to create openings within the passivation layer 133 sufficient so as to allow for electrical contact to the passivation metal layers. FIG. 11 illustrates the structure of integrated circuit device 120 after mask and etch steps have been performed. The SiN passivation layer will overlie the passivation metal layer 106 at SiN passivation overlap areas 134 and 135. A hermetic seal will be formed at the interface of the SiN passivation overlap areas 134 and 135 and the metal passivation layer 106. Thus, a hermetic seal is formed at each of the SiN passivation overlap areas 134 and 135. Similarly, a seal is formed at SiN passivation overlap areas 136 and 137 where those areas contact the passivation metal layer. Should a stronger seal be required, one with skill in the art would realize that any number of SiN passivation layers could be deposited upon the semiconductor surface and could be overlain by successive metal passivation layers. Similarly, overlapping layers of metal passivation material could also be employed. The use of multiple overlapping layers would further protect the integrated circuit device as a break in one seal would not necessarily lead to damage of the device.

FIG. 12 shows a third embodiment of the present invention in which multiple SiN passivation layers have been deposited over the top of the semiconductor surface. Alternatively, multiple SiN passivation layers could be alternated with dielectric layers. The figure illustrates SiN passivation layer 204 deposited over dielectric layer 201. Next, dielectric layer 202 is deposited. SiN passivation layer 205 is then deposited over dielectric layer 202. An addition dielectric layer 203 is then deposited over SiN passivation layer 205. After the etch steps have defined the integrated circuit chips and the bonding pads, a final SiN passivation layer 206 is deposited over the surface of the substrate. After masking and etching, metal passivation layers may be deposited as illustrated in the first embodiment of the present invention. Metal passivation layers 210 and 211 are illustrated as examples of metal passivation layers.

This multiple layer approach could also be incorporated with the second embodiment of the present invention. FIG. 13 illustrates a wafer upon which multiple layers of dielectric and passivation layers have been deposited but in which the top passivation layer is not deposited until after the deposition of the passivation metal layer. This diagram illustrates dielectric layers 301, 302, and 303, and SiN passivation layers 304, 305 and 306. Metal passivation layers 310, 311, 312, and 313 are also shown. One with skill in the art would realize that any number of layers of passivation material could be deposited and that any number of geometries could be formed.

I claim:

1. A semiconductor chip comprising a semiconductor substrate, said semiconductor substrate having a first surface;

a plurality of integrated circuit devices extending from said first surface, said integrated circuit devices being separated by a scribe lane, said scribe lane having a bottom surface and at least one side surface extending from said bottom surface to a top dielectric layer located on at least one of said integrated circuit devices, said first surface of said substrate defining said bottom surface of said scribe lane, each of said integrated circuit devices comprising at least one conductive layer and one dielectric layer, said dielectric layer including at least one bonding pad opening having a side wall extending from said conductive layer to a top surface of said integrated circuit device, said conductive layer defining a bottom surface of said bonding pad opening, said bottom surface of said bonding pad opening comprising a first portion and a second portion; and a first protective film covering said top surface of said integrated circuit device, said side and bottom surfaces of said scribe lane, said side wall and said first portion of said bottom surface of said bonding pad opening; and a second protective film covering said second portion of said bottom surface of said bonding pad opening and a portion of said first protective film.

2. The semiconductor chip in claim 1 wherein said first protective film comprises a moisture resistant material, and wherein said first protective film is transparent to ultraviolet light.

3. The semiconductor chip in claim 2 wherein said moisture resistant material comprises silicon nitride.

4. The semiconductor chip in claim 3 wherein said thickness of said first protective film is no greater than 1000 angstroms.

5. The semiconductor chip in claim 1 wherein said second protective film is an electrically conductive passivation layer, said electrically conductive passivation layer comprising a non-corrosive material.

6. The semiconductor chip in claim 5 wherein said non-corrosive material comprises electroless nickel or nickel alloy.

7. A semiconductor chip comprising a semiconductor substrate, said semiconductor substrate having a first surface;

a plurality of integrated circuit devices extending from said first surface, said integrated circuit devices being separated by a scribe lane, said scribe lane having a bottom surface and at least one side surface extending from said bottom surface to a top dielectric layer located on at least one of said integrated circuit devices, said first surface of said substrate defining said bottom surface of said scribe lane, each of said integrated circuit devices comprising at least one conductive layer and one dielectric layer, said dielectric layer including at least one bonding pad opening having a side wall extending from said conductive layer to a top surface of said integrated circuit device, said conductive layer defining a bottom surface of said bonding pad opening, each of said bottom and said side surfaces of said bonding pad opening comprising a first portion and a second portion; and a first protective film covering said first portion, said first protective film comprising a moisture resistant material, said first protective film being transparent to ultraviolet light; and a second protective film covering said second portion.

8. The semiconductor chip in claim 7 wherein said moisture resistant material comprises silicon nitride.

9. The semiconductor chip in claim 8 wherein said thickness of said first protective film is no greater than 1000 angstroms.

10. The semiconductor chip in claim 7 wherein said second protective film is an electrically conductive passivation layer, said electrically conductive passivation layer comprising a non-corrosive material.

11. The semiconductor chip in claim 10 wherein said non-corrosive material comprises electroless nickel or nickel alloy.

12. A semiconductor chip comprising:

a semiconductor substrate, said semiconductor substrate having a first surface;

a plurality of integrated circuit devices extending from said first surface, said integrated circuit devices being separated by a scribe lane, said scribe lane having a bottom surface and at least one side surface extending from said bottom surface to a top dielectric layer located on at least one of said integrated circuit devices, said first surface of said substrate defining said bottom surface of said scribe lane, each of said integrated circuit devices comprising at least one conductive layer and a plurality of dielectric layers, said plurality of dielectric layers including at least one bonding pad opening having a side wall extending from said conductive layer to a top surface of said integrated circuit device, said conductive layer defining a bottom surface of said bonding pad opening, said bottom surface of said bonding pad opening comprising a first portion and a second portion;

a first protective film disposed between said plurality of dielectric layers and covering said top surface of said integrated circuit device, said side and bottom surfaces of said scribe lane, said side wall and said first portion of said bottom surface of said bonding pad opening; and a second protective film covering said second portion of said bottom surface of said bonding pad opening and a portion of said first protective film.

\* \* \* \* \*